United States Patent [19]
Hornbeck

[11] Patent Number: 5,411,769
[45] Date of Patent: May 2, 1995

[54] METHOD OF PRODUCING MICROMECHANICAL DEVICES

[75] Inventor: Larry J. Hornbeck, Van Alstyne, Tex.

[73] Assignee: Texas Instruments Incorporated, Dallas, Tex.

[21] Appl. No.: 128,459

[22] Filed: Sep. 29, 1993

Related U.S. Application Data

[60] Division of Ser. No. 823,580, Jan. 16, 1992, Pat. No. 5,331,454, which is a continuation of Ser. No. 612,946, Nov. 13, 1990, abandoned.

[51] Int. Cl.⁶ .............................................. B05D 3/06
[52] U.S. Cl. .................................. 427/534; 427/162; 427/255.6; 427/294; 427/301; 427/307; 427/314; 427/539

[58] Field of Search ................ 427/162, 301, 307, 314, 427/539, 294, 534, 255.6

Primary Examiner—Bernard Pianalto
Attorney, Agent, or Firm—Julie L. Reed; James C. Kesterson; Richard L. Donaldson

[57] ABSTRACT

It is possible to use an oriented monolayer to limit the Van der Waals forces between two elements by passivation. The invention disclosed here details how to do so by building the device to be passivated, cleaning the surface to be passivated, activating the surface, heating it along with the material to be used as the monolayer, exposing a vapor of the material to the surface and evacuating the excess material, leaving only the monolayer.

19 Claims, 6 Drawing Sheets

METHOD OF PRODUCING MICROMECHANICAL DEVICES

This is a division of application Ser. No. 07/823,580, filed Jan. 16, 1992, now U.S. Pat. No. 5,331,454, which is a continuation, of application Ser. No. 07/612,946, filed Nov. 13, 1990, abandoned.

BACKGROUND OF THE INVENTION

1. Field of the Invention

This invention deals with micromechanical devices, more particularly with micromechanical deformable mirror devices.

2. Description of the Prior Art

There are many different types of micromechanical devices, three of which are micro-motors, micro-gears, and micromechanical deformable mirror devices (DMD). Micromechanical DMDs contain an activation or addressing electrode, a support post or posts, underneath a hinge or hinges, which in turn supports a deflection element suspended over the electrode. The DMDs are primarily used in the direction of light in optical systems, with a mirrored deflection element.

The operation of such devices involves activating the electrode which builds up electrostatic charge in the gap between electrode and deflection element. The deflection element then flexes on its hinge or hinges and moves towards the electrode. When the charge is removed, the deflection element returns to its undeflected position.

Contact between the operating and supporting pieces of micromechanical devices such as micro-gears and micro-motors may result in sticking. Likewise, if the deflection element of a DMD comes into contact with the electrode, it may possibly stick in the deflected position. One method of freeing the deflection element of a DMD is by the application of a voltage pulse train with a frequency around the resonant frequency of the hinge. When the pulse train ceases, the deflection element returns to its undeflected position.

This method of reset works very well. However, after many contacts between electrode and deflection element, the wear increases the effective contact area. This requires higher and higher voltages for reset.

SUMMARY OF THE INVENTION

It is an object of this invention to provide a passivation layer for points of contact in micromechanical devices. It as another object of this invention to provide the method in which such a layer is developed. Other objects and advantages will be obvious, and will in part appear hereinafter and will be accomplished by the present invention which provides a technique for surface passivation in micromechanical devices. This technique comprises the cleaning of the surface, the heating of the device with the source material in an evacuated chamber, and the deposition of the source material onto the device, resulting in an oriented monolayer for surface passivation.

BRIEF DESCRIPTION OF THE DRAWINGS

For a complete understanding of the invention, and the advantages thereof, reference is now made to the following description in conjunction with the accompanying drawings, in which.

DETAILED DESCRIPTION OF THE INVENTION

Figure 1A:
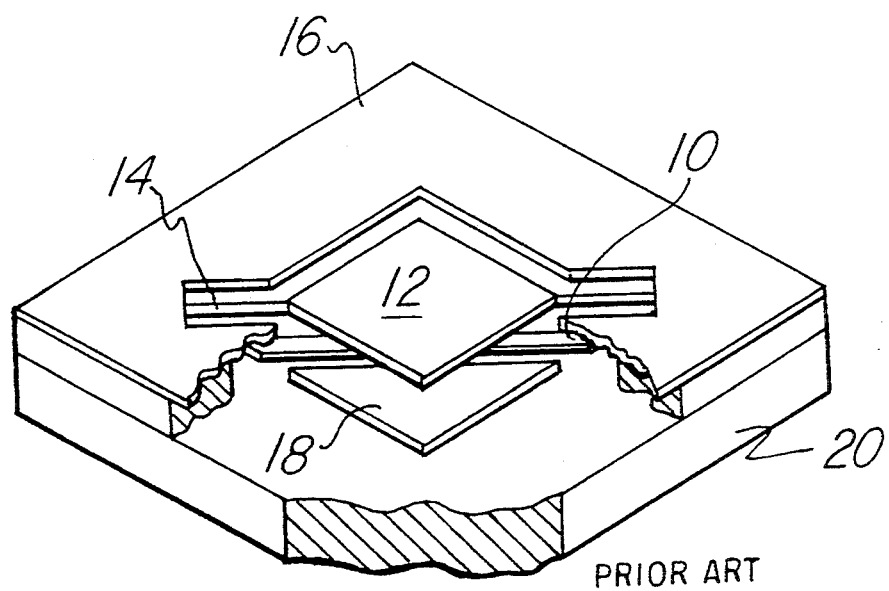
FIG. 1a shows an undeflected prior art torsion beam DMD.
Figure 1B:
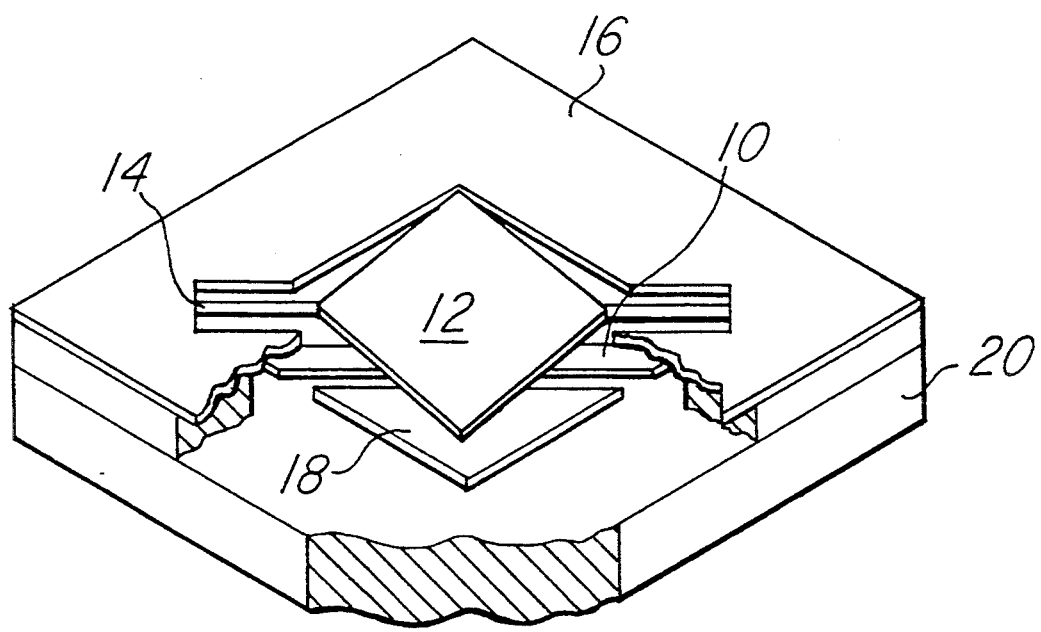
FIG. 1b shows a deflected prior art torsion beam DMD.

FIG. 1a shows an undeflected torsion beam DMD (deformable mirror device). When address electrode 10 is activated, an electrostatic attractive force builds between the electrode and the deflection element 12. In FIG. 1b, the attraction between the two causes the deflection element to bend on its hinge 14, which is supported by support layer 16. The element twists and its edge touches or lands on the substrate 20 at landing electrode 18.

The contact between the electrode 18 and the element 12 results in attractive inter-molecular forces between the two surfaces commonly referred to as Van der Waals forces. Van der Waals forces increase as the surface energy of a material increase. The ratio of the Van der Waals forces to the restorative forces in the beam increases over time. As more landings are made, the contact area between the surfaces increases, and the element has a more difficult time overcoming the increasing Van der Waals forces and breaking free of the landing electrode when the addressing electrode is deactivated by removal of the voltage. Eventually, the element cannot break free of the landing electrode. This can be overcome by application of a voltage pulse train to the landing electrode. Over time, the amount of voltage applied must be increased to compensate for increasing Van der Waals forces. Finally, the necessary amount of voltage to free the element results in too much electrostatic force on the beam, such that the element my damaged and possibly even causing the beam to snap off of its hinge.

Figure 2:
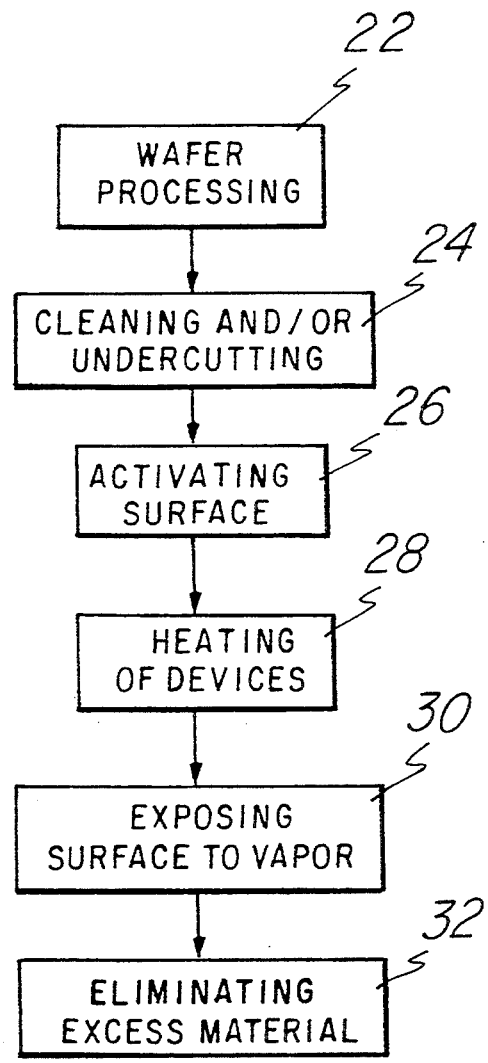
FIG. 2 shows a flow diagram of the method of this invention.

According to the present invention, a better method to eliminate problems of this sort is to passivate the devices as shown in FIG. 2. The necessary processing at the wafer level is accomplished in step 22. In the case of the DMD, this involves among other things layering and etching the wafer with the electrode circuitry, the organic spacer and the mirror surface. The wafers are then divided up into chips and the process moves on to step 24.

According to step 24, the surfaces of the micromechanical device that is to be activated must be cleaned. With the-DMD, in addition to cleaning the devices, the organic spacer must be undercut to allow free movement of the deflection elements upon their posts. This is typically accomplished with a plasma etch. Consequently after a plasma etch step, the cleaning may be accomplished with oxygen plasma at room temperature. Cleaning removes any organic contaminants and chemisorbed and physisorbed water from the surface. This method also eliminates the possibility of mechanical damage to the DMD, which can occur with the use of solvents and high temperature baking.

After cleaning the surfaces of the devices, the device surfaces are then activated as shown in step 26 by placing them into a oxygen/fluorine plasma. Typical conditions for this step are: Power—100W; Pressure—2 torr; Flow rates ($NF_3$—2 SCCM, $O_2$—180 SCCM, He—50 SCCM); Temp—Room; and Time—20 sec. Activation provides a high energy surface which allows the source material molecules to form into a close-packed oriented monolayer.

The heating of devices as required by step 28 can be done in many ways. A preferred method is to place the chips with the surfaces to be passivated fully exposed, and a small quantity of the source material to be used as the passivating material together in a covered glass container. In this case, powdered perfluordecanoic acid (PFDA) is placed in the container as the passivating material. This covered container is then placed in a vacuum oven. As the PFDA begins to melt, it produces a vapor that deposits upon the exposed and activated surfaces of the chips.

As shown in step 30, afar the deposition is finished, the cover of the container is then removed and the oven is evacuated and continuously pumped to eliminate any excess source material. This ensures that the only PFDA left is that which is in the deposited monolayer upon the chips.

Figure 3A:
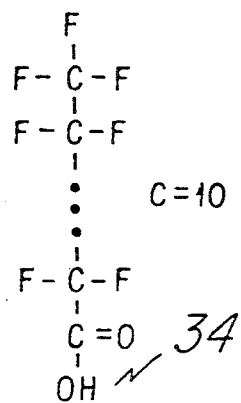
FIG. 3a shows the molecular structure of a perfluordecanoic acid (PFDA) molecule.
Figure 3B:
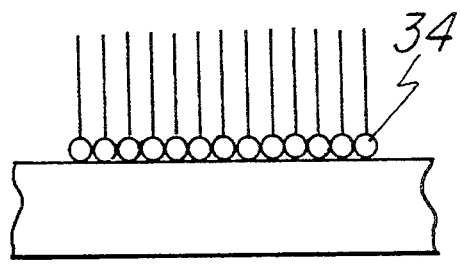
FIG. 3b shows a monolayer upon a substrate.
Figure 3C:
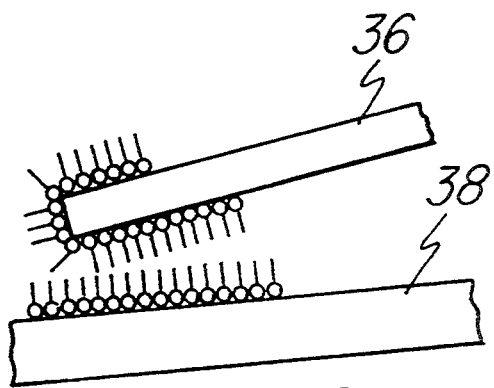
FIG. 3c shows a beam tip and an electrode actor passivation.

FIG. 3a shows the molecular structure of a molecule of PFDA. The COOH group 34 is the polar end that will be oriented to contact the surface to be passivated. FIG. 3b shows the relationship of the molecule to the substrate afar passivation. The polar end 34 forms a bond with the surface, orienting the PFDA molecule accordingly. FIG. 3c shows the beam 36 and the landing electrode 38 with their respective monolayers of the passivation material. These monolayers help prevent the build up of the Van der Waals forces between the two pieces, by lowering the surface energy.

Figure 4:
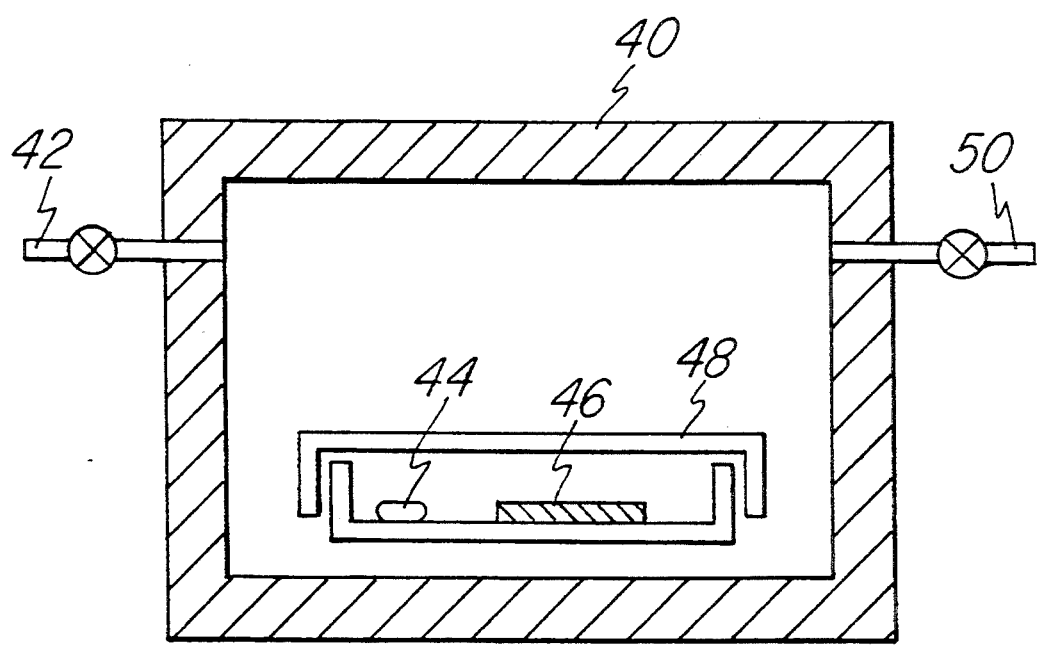
FIG. 4 shows a single chamber deposition apparatus.

FIG. 4 shows one of the many ways the vapor deposition can be accomplished. Oven 40 is preheated to 80° C. Source material 44, in this case PFDA, is placed with the chips 46 in the glass container 48. These are placed in the oven which is evacuated by valve 50, and back-fired through valve 42 with dry $N_2$. When the PFDA reaches its melting temperature it produces a vapor which is deposited onto the surface of the chips. The lid of the container is removed after about 5 minutes of deposition, and the oven is evacuated and continuously pumped to eliminate the excess PFDA.

Figure 5:
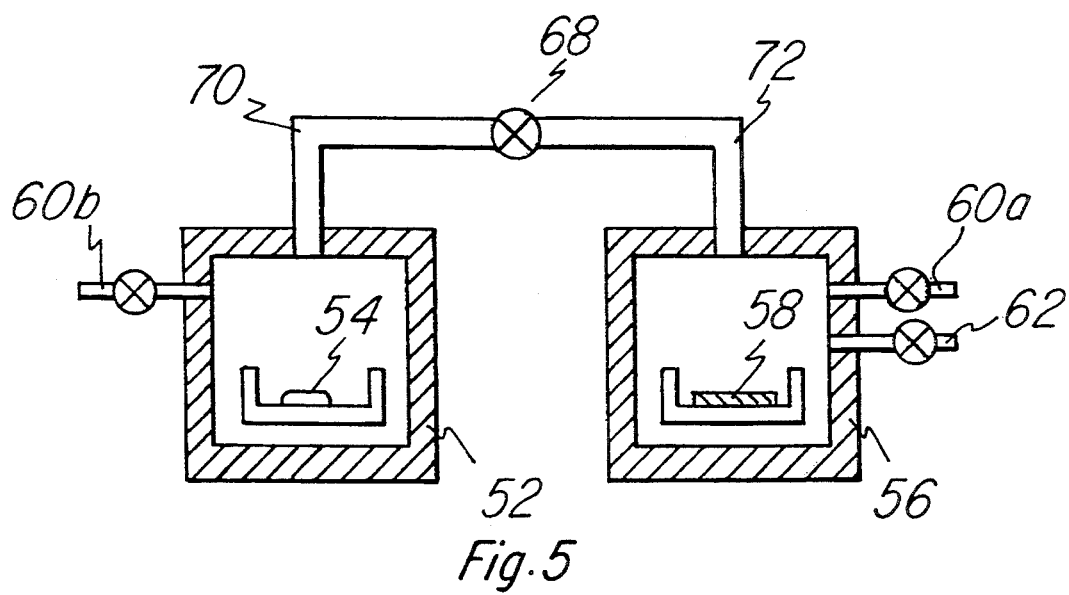
FIG. 5 shows a dual chamber deposition apparatus.

FIG. 5 shows an alternate configuration for the vapor deposition process. Two ovens are used, connected by a tube containing a valve. Oven 52 contains the source 54 and oven 56 contains the chips 58. The valve 68 is opened and both chambers are evacuated. The valve is then closed. The ovens are backfilled with $N_2$ through valves 60a and 60b. When the source begins to vaporize, the valve is opened and the vapor allowed to travel into the second oven, along pipe 70 past the valve and into pipe 72. When the time is up, the valve is closed, and the second oven evacuated and pumped through valve 62. The only PFDA left in the second oven is that which was deposited as the monolayer.

The unique nature of the resultant monolayer produces many beneficial effects, three of which are low surface energy, low coefficient of friction, and high wear resistance. These effects result from three properties of the layer. First, the —$CF_3$ terminal group forms the outermost layer of the absorbed monolayer and it is this group that is responsible for the low Van der Waals force, or low surface energy and low coefficient of friction of a surface treated with such a monolayer. Second, the polar ends of the molecules are strongly adsorbed onto the substrate. Third, the molecular chains are closely packed and oriented parallel to one another so as to give stiffness to the film in a direction parallel to the substrate surface. Longer chains give greater wear resistance because, at a critical value of chain length, the monolayer undergoes a phase transition from a condensed liquid to a solid. Any long-chain aliphatic halogenated polar compound, that is, a compound with a terminal COOH group and a terminal $CF_8$ group, can be used.

Thus, although there has been described to this point particular embodiments for passivation techniques, using an oriented monolayer, it is not intended that such specific references be considered as limitations upon the scope of this invention except in-so-far as set forth in the following claims.

What is claimed is:

1. A method for producing a low surface energy wear resistant thin film on the surface of a micromechanical device comprising the steps of:
   a) cleaning said device;
   b) activating the surface of said cleaned device;
   c) heating said activated surface;
   d) heating a source material to produce a vapor, wherein said source material is a long-chain aliphatic halogenated polar compound; and
   e) exposing said activated surface to said source material vapor to deposit a passivating layer on said surface.

2. The method of claim 1 wherein said exposing step deposits an oriented monolayer of said source material.

3. The method of claim 1 wherein said micromechanical device is a deformable mirror device.

4. The method of claim 1 wherein said activating step comprises the step of placing said device into an oxygen plasma.

5. The method of claim 1 wherein said step of heating said device surface and said source material, and said step of exposing the device surface to a source material vapor comprises the steps of placing said device and said source material in a covered container and then placing said covered container in a vacuum oven and heating said vacuum oven.

6. The method of claim 1 wherein said long-chain aliphatic halogenated polar compound is perfluordecanoic acid (PFDA).

7. The method of claim 1 further comprising the step of removing excess long-chain aliphatic halogenated polar compound from said device.

8. The method of claim 7 wherein said step of removing excess long-chain aliphatic halogenated polar compound from said device comprises evacuating a chamber containing said device.

9. A method for producing a low surface energy wear resistant thin film on the surface of a micromechanical device comprising the steps of:
   a) cleaning said device;
   b) activating the surface of said cleaned device;
   c) heating said activated surface;
   d) heating a source material to produce a vapor; and
   e) exposing said activated surface to said vapor to deposit a passivating layer on said activated surface.

10. The method of claim 9 wherein said exposing step deposits an oriented monolayer of source material.

11. The method of claim 9 wherein said device is a deformable mirror device.

12. The method of claim 9 further comprising the step of removing excess source material from said device.

13. The method of claim 12 wherein said step of removing excess source material from said device comprises evacuating a chamber containing said device.

14. The method of claim 9 wherein said step of heating said device surface and said source material, and said step of exposing the device surface to a source material vapor comprises the steps of placing said device and said source material in a covered container and then placing said covered container in a vacuum oven and heating said vacuum oven.

15. The method of claim 9 wherein said activating step comprises the step of placing said device in an oxygen plasma.

16. A method for producing a low surface energy wear resistant oriented monolayer on the surface of a deformable micromirror device comprising the steps of:
 a) cleaning said device;
 b) placing said cleaned device in an oxygen plasma to activate the surface of said cleaned device;
 c) placing said device and a long-chain aliphatic halogenated polar compound in a covered container;
 d) heating said covered container in a vacuum oven to produce a vapor of said long-chain aliphatic halogenated polar compound;
 e) exposing said activated surface to said long-chain aliphatic halogenated polar compound vapor to deposit a passivating layer on said surface.

17. The method of claim 16 wherein said long-chain aliphatic halogenated polar compound is perfluordecanoic acid.

18. The method of claim 16 further comprising the step of removing excess long-chain aliphatic halogenated polar compound from said device.

19. The method of claim 18 wherein said step of removing excess long-chain aliphatic halogenated polar compound from said device comprises evacuating a chamber containing said device.

* * * * *